United States Patent [19]

Tse et al.

[11] Patent Number: 5,220,220
[45] Date of Patent: Jun. 15, 1993

[54] NOISE SUPPRESSION SYSTEM

[75] Inventors: Lawrence T. Tse, Nepean; Ronald R. House, St. Ann's, both of Canada

[73] Assignee: Gennum Corporation, Burlington, Canada

[21] Appl. No.: 803,800

[22] Filed: Dec. 9, 1991

Related U.S. Application Data

[63] Continuation of Ser. No. 409,858, Sep. 20, 1989, abandoned.

[51] Int. Cl.$^5$ .......................... H03K 5/00; H03B 1/00
[52] U.S. Cl. ..................................... 307/521; 307/234; 307/354; 328/162; 328/167; 328/111
[58] Field of Search ............... 307/520, 521, 234, 362, 307/354; 328/167, 162, 165

[56] References Cited

U.S. PATENT DOCUMENTS

| | | | |
|---|---|---|---|
| 3,484,624 | 12/1969 | Rasiel et al. | 307/362 |
| 3,573,493 | 4/1971 | Kamin | 307/234 |
| 4,322,641 | 3/1982 | Packard | 307/521 |
| 4,667,120 | 5/1987 | Okada et al. | 307/521 |
| 4,687,998 | 8/1989 | Takatori et al. | 307/362 |
| 4,748,352 | 5/1988 | Kamiya et al. | 307/592 |
| 4,799,024 | 1/1989 | Fischer | 307/234 |
| 4,864,163 | 9/1989 | Nakao et al. | 307/234 |
| 4,992,674 | 2/1991 | Smith | 307/351 |

*Primary Examiner*—Timothy P. Callahan
*Attorney, Agent, or Firm*—Bereskin & Parr

[57] ABSTRACT

The noise suppression system has a discriminator, an amplitude circuit and a filtering circuit. The discriminator has an input sensor, a timer and a decision unit. The input sensor senses when the incoming signal is over a given amplitude threshold and starts the timer running. The decision unit determines when the time is over a given time threshold and the discriminator informs the amplitude circuit. The amplitude circuit has an amplitude sensor and a control unit. The amplitude sensor senses the amplitude of the incoming signal when the discriminator has a signal over the given time threshold and the amplitude sensor relays the amplitude to the control unit. The control unit outputs a control signal. The control unit has two amplitude thresholds, the control signal being at a constant minimum below the first threshold, proportional to the amplitude sensor amplitude between the thresholds, and at a constant maximum above the second threshold. The control signal is sent to the filtering circuit which has a filter and an intensity equalizer. The filter is a high pass filter whose cut-off frequency is controlled by the control signal and the intensity equalizer boosts the filtered signal according to the amplitude of the control signal.

24 Claims, 3 Drawing Sheets

NOISE SUPPRESSION SYSTEM

This is a continuation of application Ser. No. 07/409,858 filed Sep. 20, 1989 now abandoned.

FIELD OF THE INVENTION

This invention relates to noise suppression systems.

BACKGROUND OF THE INVENTION

Noise has long been a problem in electronic applications. Many techniques have been developed to discriminate between a desired signal and noise.

In most cases the noise which is to be suppressed differs in its temporal characteristics from the desired signal. For instance, speech signals tend to contain bursts of information whereas a noise signal, such as low frequency noise from an air conditioning unit, tends to have the same amplitude over a longer period of time.

Simple noise suppression systems have been designed to integrate the incoming signal, a desired signal plus noise, over a given period of time and compare the integrated value with a threshold. Above the threshold it is assumed there is noise and a filter kicks in to remove the noise.

This simple system has a number of drawbacks. The integrator is amplitude sensitive. A large amplitude short duration signal, normally containing non-noise information, can be over the threshold when integrated. This will generate a false trigger of the filter. As well, when the filter kicks in some of the signal strength will be lost. The difference in strength between a filtered and non-filtered signal will be evident at the output. In many instances this is undesirable, especially when dealing with audio signals.

It is an object of this invention to overcome one or more of these problems.

SUMMARY OF THE INVENTION

In a first aspect the invention provides a device for producing from an input signal, a control signal, for use in a noise suppression system, said device comprising: (a) input port means for receiving said input signal; (b) an input sensor connected to said input port means and having an output; (c) a timer connected to said output of said input sensor and having a timer output; (d) said input sensor including means for determining when the amplitude of said input signal at said input port means exceeds a predetermined amplitude which is greater than zero and for enabling operation of said timer to produce a timer output signal at said timer output when the amplitude of said input signal exceeds said predetermined amplitude and for disabling operation of said timer when the amplitude of said input signal is less than said predetermined amplitude; (e) a decision unit connected to said timer output and responsive to said output signal for determining when the duration of the input signal is greater than the pre-determined time threshold while the amplitude of said input signal is greater than said pre-determined amplitude and for thereupon producing a control signal; (f) said timer comprising a first current source having a control input and a capacitor connected to the output of said first current source and to said timer output and thereby being connected to said decision unit, said control input being connected to the output of said input sensor for said first current source to charge said capacitor when an input signal exists above said pre-determined amplitude, and said timer including a second current source connected to said capacitor for discharging said capacitor at the same time as said first current source is charging said capacitor, said second current source discharging said capacitor at a rate less than that at which said first current source charges said capacitor, whereby the voltage on the capacitor is a measure of the duration of the input signal.

In a second aspect the invention provides a noise suppression system for use with an input signal, the system comprising: (a) input port means for receiving said input signal; (b) a timer having a timer output and being connected to said input port means for timing the duration of the input signal and for producing a timer signal at said timer output; (c) a decision unit connected to said timer output for determining from said timer signal when the duration of the input signal is greater than a pre-determined time threshold, said decision unit having a control output; (d) a filter having a signal output connected to said input port means, said filter having a filter output and having a filter control input and being responsive to a control signal at said filter control input for adjusting a characteristic of said filter; and (e) circuit means connected between said control output of said decision unit and said control input for producing said control signal for causing said filter to filter the input signal when the duration of the input signal is greater than said pre-determined time threshold and for causing said filter to pass the input signal substantially unfiltered when the duration of said input signal is less than said pre-determined time threshold.

BRIEF DESCRIPTION OF THE DRAWINGS

For a better understanding of the present invention, and to show more clearly how it may be carried into effect, reference will now be made, by way of example to the accompanying drawings, which show the preferred embodiment of the present invention, and in which.

DETAILED DESCRIPTION OF THE DRAWINGS

Figure 1:
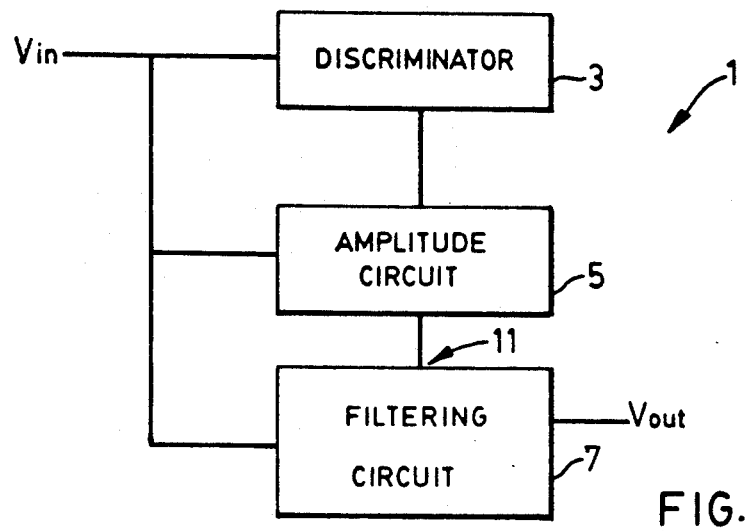
FIG. 1 is a block diagram of a noise suppression system according to the preferred embodiment of the present invention.

Reference will now be made to FIG. 1 in describing a noise suppression system 1. An input voltage signal $V_{in}$ is input to a discriminator 3, an amplitude circuit 5 and a filtering circuit 7. The discriminator 3 is connected to the amplitude circuit 5 and the amplitude circuit 5 is further connected to the filtering circuit 7.

The filtering circuit 7 has an output for an output signal $V_{out}$.

In operation, the discriminator 3 determines the duration of the input signal $V_{in}$. When the duration is greater than a time second threshold the discriminator 3 informs the amplitude circuit 5. The amplitude circuit 5 determines the amplitude of the input signal $V_{in}$ when the duration of $V_{in}$ is greater than the time second threshold. A control amplitude signal representative of the amplitude of the input signal $V_{in}$ is input to the filtering circuit 7 at a second control input 11. The filtering circuit 7 then filters the noise, or other undesirable portion, from the input signal $V_{in}$ with the amount of filtering performed according to the control amplitude.

It is not strictly speaking necessary to employ the amplitude Circuit 5, the discriminator 3 could be directly connected to the second control input 11. The filtering circuit 7 would be simply switched on and off by the discriminator 3. This would be an inexpensive and simple implementation where $V_{in}$ is expected to have a fairly constant amplitude.

Speech and noise signals typically have different temporal characteristics. Speech usually comes in the form of short bursts, whereas noise is quite often continuous or at least of a substantially longer duration than speech. An example of noise would be that caused by a nearby air conditioner which would be running for long periods of time. The time second threshold should be set long enough to include expected noise signals but not short enough to include speech signals. The inventors have found speech signals are typically less than 100 to 200 milliseconds in duration. A time second threshold within or exceeding this duration should be appropriate in most circumstances.

It may be desirable to vary the time second threshold. In industrial situations noise is often of shorter durations and the time second threshold may be reduced for these needs. Variation of the time second threshold to suit a user moving from one environment to another would also be a desirable feature.

As noise is typically in the lower frequency ranges, the filtering circuit 7 is a high-pass filter.

Figure 2:
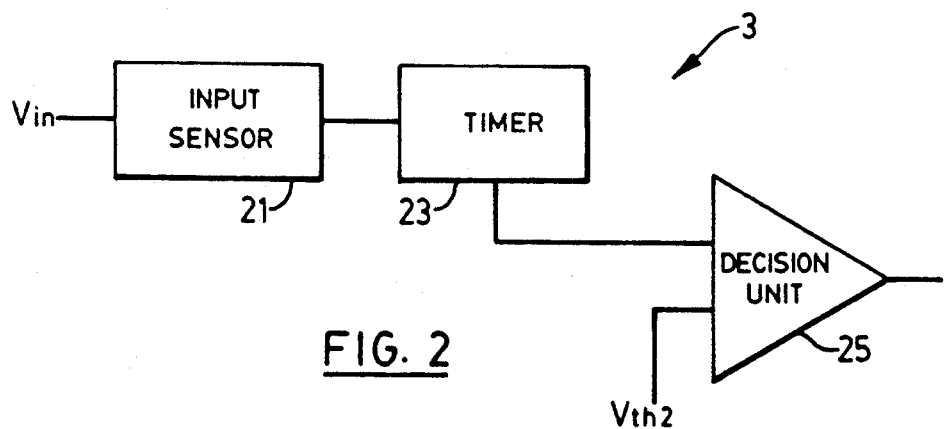
FIG. 2 is a block diagram of a discriminator employed in the system of FIG. 1.

Referring to FIG. 2, a discriminator 3 has an input sensor 21, a timer 23 and a decision unit 25. The input sensor 21 receives the input signal $V_{in}$ and senses whether $V_{in}$ has a substantial amplitude. A substantial amplitude is one which would result in a signal $V_{out}$ worthy of requiring the operation of the system 1. The input sensor 21 is connected to the timer 23 and informs the timer 23 of the existence of a $V_{in}$ of substantial amplitude. The timer 23 is switched on and times the duration of $V_{in}$. The timer 23 is connected to the decision unit 25. When $V_{in}$ causes the timer 23 to time a duration of $V_{in}$ greater than the time second threshold, the decision unit 25 informs the amplitude circuit 5 of FIGS. 1 and 3. The decision unit 25 may be implemented using a comparator 25 having a threshold $V_{th2}$, being the time second threshold.

Figure 3:
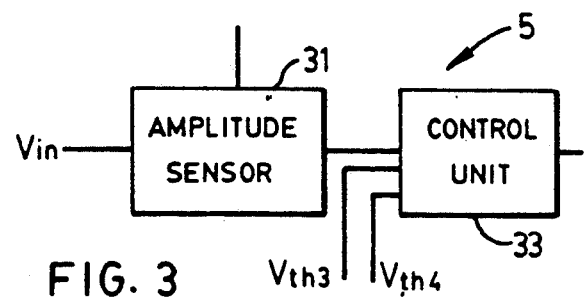
FIG. 3 is a block diagram of a band-pass or frequency dependent amplitude circuit employed in the system of FIG. 1.

Referring to FIG. 3, the amplitude circuit 5 is broken down into a band-pass amplitude sensor 31 and control unit 33. The amplitude sensor 31 receives $V_{in}$ and also receives the information from the discriminator 3. When the duration, determined by the discriminator 3, is greater than the time second threshold, the amplitude sensor 31 is enabled. When enabled the amplitude sensor 31 determines the amplitude of $V_{in}$ and passes the amplitude to the control unit 33.

The control unit 33 has amplitude third and fourth thresholds, $V_{th3}$ and $V_{th4}$; outputs the control amplitude signal; and determines whether the amplitude of $V_{in}$ is below the third threshold, between the third and fourth thresholds or above the fourth threshold. When the amplitude of $V_{in}$ is less than the third threshold, the control unit amplitude signal is at a substantially constant minimum level. When the amplitude of $V_{in}$ is between the third and fourth thresholds the control amplitude is representative of the amplitude of $V_{in}$. When the amplitude of $V_{in}$ is greater than the fourth threshold, the control amplitude is at a substantially constant maximum level.

Figure 4:
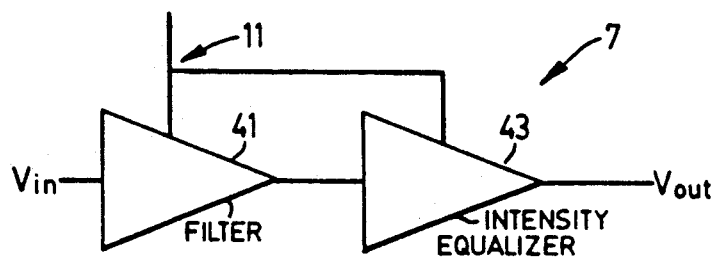
FIG. 4 is a block diagram of a filtering circuit employed in the system of FIG. 1.

Referring to FIG. 4, the filtering circuit has a filter 41 and an intensity equalizer 43. The filter 41 is connected to the second control input 11 and also receives $V_{in}$. The filter 41 is an active high-pass filter 41 adjusting its corner frequency according to the control amplitude. The greater the control amplitude, the higher the corner frequency of the filter 41 and the more $V_{in}$ is filtered.

The control unit 33 has two thresholds as the minimum level of filtering does not significantly effect $V_{in}$ and the noise in $V_{in}$ below the third threshold would likely not significantly effect $V_{out}$ so there is no need to adjust the filter 41. The corner frequency of the filter at the minimum, level should be set at the maximum amount to not affect speech quality for normal speech operation. This effectively passes $V_{in}$ unfiltered. For $V_{in}$ above the fourth threshold the control amplitude is held at a maximum, level to prevent the corner frequency of the filter 41 becoming so high as to filter out all speech intelligibility from signals in $V_{in}$. For signals between the third and fourth thresholds it is assumed the noise is in proportion to the amplitude of $V_{in}$ and will require commensuration filtering.

The intensity equalizer 43 is connected to the filter 41 and also the second control input 11, receiving the control amplitude from the control unit 33 of FIG. 3. The intensity equalizer 43 amplifies the filtered $V_{in}$ according to the control amplitude. The intensity equalizer compensates for reduction in the amplitude of $V_{in}$, by the filter 41, to produce an output signal $V_{out}$ of substantially the same amplitude, or perceived loudness, as $V_{in}$.

Figure 5:
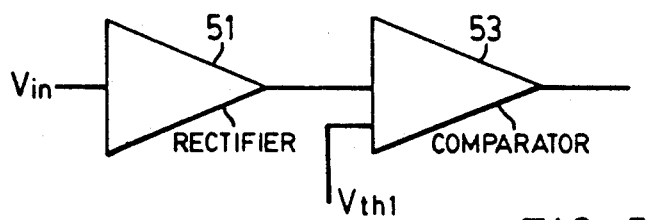
FIG. 5 is a block diagram of an input sensor employed in the discriminator of FIG. 2.

Referring to FIG. 5, the input sensor 21 has a first rectifier 51 and a comparator 53. The rectifier 51 receives $V_{in}$ and rectifies it. The comparator 53 has first and second comparison inputs, one connected to the rectifier 51 and the other to an amplitude first threshold $V_{th1}$. The comparator 53 determines whether the rectified $V_{in}$ is greater than the amplitude first threshold $V_{th1}$. $V_{th1}$ should be set at a level to determine whether the amplitude of $V_{in}$ is substantial as discussed previously.

Figure 6:
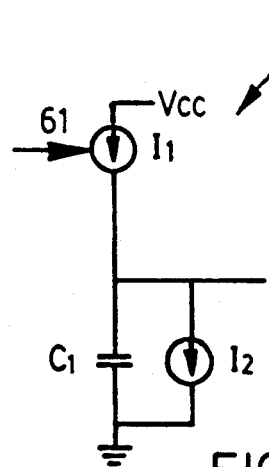
FIG. 6 is a block diagram of a timer employed in the discriminator of FIG. 2.
Figure 8:
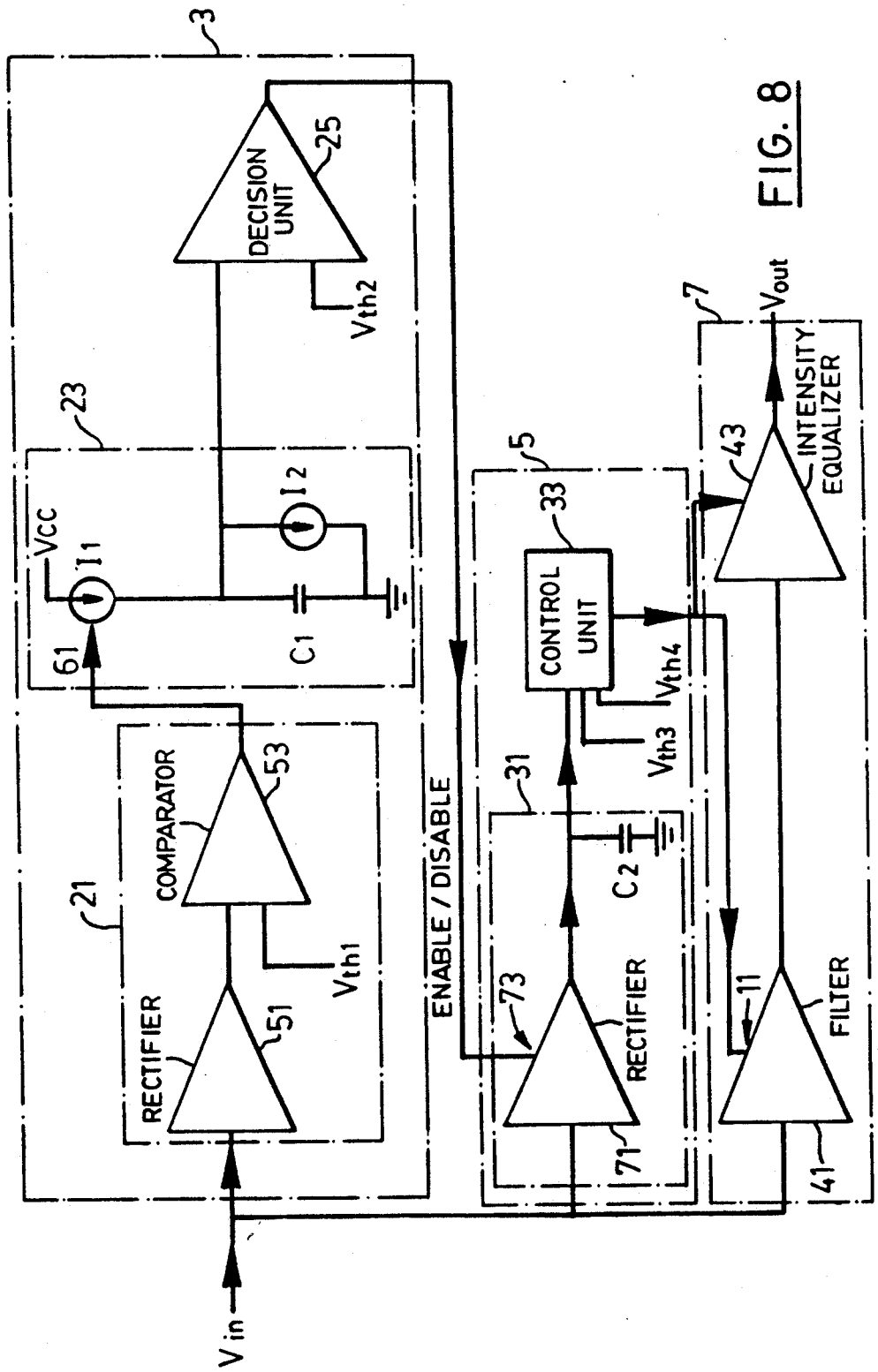
FIG. 8 is a detailed block diagram of the system of FIG. 1, incorporating the elements of FIGS. 2 through 7.

Referring to FIG. 6, the timer 23 has a first current source $I_1$ connected between a supply voltage $V_{cc}$ and one end of a capacitor $C_1$. The other end of the capacitor $C_1$ is grounded. Connected across the capacitor $C_1$ is a second current source $I_2$. The first current source $I_1$ has a first control input 61. The first control input 61 is connected to the comparator 53 and the one end of the capacitor $C_1$ is connected to the decision unit 25, as shown in FIG. 8.

In operation, the current source $I_1$ is switched on when the rectified $V_{in}$ at the comparator 53 is greater than $V_{th1}$. The current source $I_1$ charges the capacitor $C_1$, while current source $I_2$ discharges the capacitor $C_1$. $I_1$ must be greater than $I_2$. The voltage on the capacitor $C_1$ builds up until the comparator 53 switches current source $I_1$ off. The time threshold is reached once $C_1$ charges up to the level $V_{th2}$ at which point the decision unit 25 enables the amplitude circuit 5. Current source $I_2$ helps to discharge the capacitor $C_1$ quickly in order for the timer 23 to be ready to time the duration of $V_{in}$ again when required. Without current source $I_2$, $C_1$ might retain a voltage and a short duration $V_{in}$ might appear to be of longer duration.

The actual voltage level required across $C_1$ to represent the time second threshold $V_{th2}$ will be determined by a combination of the capacitance of $C_1$, and the magnitudes of $I_1$ and $I_2$. The speed at which the time second threshold is reached can be effectively varied by varying $V_{th2}$, the capacitance of capacitor $C_1$, and/or the levels of $I_1$ and $I_2$ in tandem. This may be used as a user adjustable time threshold for use of the system 1 in varying environments.

Figure 7:
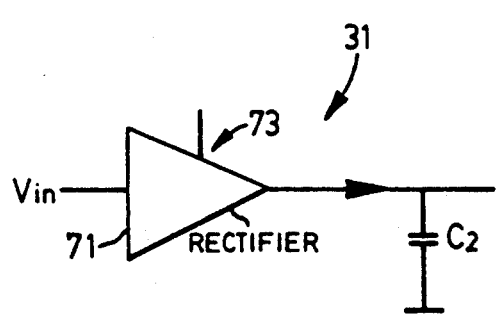
FIG. 7 is a block diagram of an amplitude sensor employed in the amplitude circuit of FIG. 3.

Referring to FIG. 7, an amplitude-sensor has a second rectifier 71 and a second capacitor $C_2$. The rectifier 71 is connected between $V_{in}$ and one end of the capacitor $C_2$. The rectifier 71 has a fourth control input 73 from the decision unit 25, as shown in FIG. 8. The other end of the capacitor $C_2$ is grounded. The one end of the capacitor $C_2$ is further connected to the control unit 33, as shown in FIG. 8.

The rectifier 71 is enabled or disabled by the decision unit 25 when the duration of $V_{in}$ is over the time second threshold or when it is not, respectively. When the rectifier 71 is disables $V_{in}$ passes through the rectifier 71, and as $V_{in}$ is a substantially AC signal little voltage builds up on $C_2$. The control unit 33 will sense a substantially zero amplitude signal. The control unit 33 will keep filtering to the minimum level and $V_{in}$ will pass substantially unfiltered through the filter 41 and intensity equalizer 43 to Vout.

When the rectifier 71 is enabled $V_{in}$ is rectified by the rectifier 71 and charges the capacitor $C_2$. When the voltage on $C_2$ becomes greater than that representative of an amplitude of $V_{in}$ over the third threshold, the control unit 33 will adjust the filter 41 and intensity equalizer 43 increasingly, until the maximum level is reached. $V_{in}$ will be filtered and amplified to produce $V_{out}$.

As the discriminator 3 acts mainly on the temporal characteristics of $V_{in}$ prior to enabling the amplitude circuit 5, the effects of large amplitude, short duration signals are minimized.

It will be understood by those skilled in the art that other embodiments will fall within the spirit and scope of the present invention as defined by the following claims.

We claim:

1. In a noise suppression system, a device for producing, from an input signal, a control signal, said device comprising:
 (a) input port means for receiving said input signal;
 (b) an input sensor connected to said input port means and having an output;
 (c) a timer connected to said output of said input sensor and having a timer output;
 (d) said input sensor including means for determining when the amplitude of said input signal at said input port means exceeds a pre-determined amplitude which is greater that zero and for enabling operation of said timer to produce a timer output signal at said timer output when the amplitude of said input signal exceeds said pre-determined amplitude and for disabling operation of said timer when the amplitude of said input signal is less that said pre-determined amplitude;
 (e) a decision unit connected to said timer output and responsive to said output signal for determining when the duration of the input signal is greater than the pre-determined time threshold while the amplitude of said input signal is greater that said pre-determined amplitude and for thereupon producing a control signal;
 (f) said timer comprising a first current source having a control input and a capacitor connected to said first current source and to said timer output and thereby being connected to said decision unit, said control input being connected to the output of said input sensor for said first current source to charge said capacitor when an input signal exists above said predetermined amplitude, and said timer including a second current source connected to the said capacitor for discharging said capacitor at the same time as said first current source is charging said capacitor, said second current source discharging said capacitor at a rate less than that at which said first current source charges said capacitor, whereby the voltage on the capacitor is a measure of the duration of the input signal.

2. A system according to claim 1, wherein the input sensor comprises a rectifier between the input means and said control input of said first current source.

3. A system according to claim 2, wherein the input sensor further comprises a comparator between the rectifier and said control input of said first current source, the comparator having first and second comparator inputs, the first comparator input being connected to the rectifier and the second comparator input being connected to a reference signal representative of said predetermined amplitude, whereby the input sensor only enables operation of said timer in the presence of an input signal having a rectified amplitude greater than said predetermined amplitude.

4. A system according to claim 1, wherein said predetermined time threshold is between 100 milliseconds and 200 milliseconds.

5. A system according to claim 4, wherein said predetermined time threshold is adjustable.

6. A system according to claim 3, wherein said predetermined time threshold is between 100 milliseconds and 200 milliseconds and the rate at which said predetermined time threshold is reached is adjustable by varying the capacitance of the capacitor.

7. A system according to claim 3, wherein said predetermined time second threshold is variable.

8. A noise suppression system for use with an input signal, the system comprising:
 (a) input port means for receiving said input signal;
 (b) a timer having a timer output and being connected to said input port means for timing the duration of the input signal and for producing a timer signal at said timer output;
 (c) a decision unit connected to said timer output for determining from said timer signal when the duration of the input signal is greater than a predetermined time threshold, said decision unit having a control output;
 (d) a filter having a signal input connected to said input port means, said filter having a filter output and having a filter control input and being responsive to a control signal at said filter control input for adjusting a characteristic of said filter; and (e) circuit means connected between said control output of said decision unit and said filter control input for producing said control signal for causing said filter to filter the input signal when the duration of the input signal is greater than said predetermined time threshold and for causing said filter to pass the input signal substantially unfiltered when the duration of said input signal is less than said predetermined time threshold.

9. A system according to claim 8, further comprising an intensity equalizer connected to said filter output for receiving therefrom an output signal from said filter, the intensity equalizer having a control input connected to said circuit means and being responsive to said control signal for amplifying said output signal from said filter when said output signal is filtered, and for passing substantially unamplified said output signal from said filter when said output signal is substantially unfiltered.

10. A system according to claim 8 wherein said circuit means comprises amplitude sensor means connected between said control output of said decision unit and said control input of said filter, said amplitude sensor means including means for sensing the amplitude of the input signal when the decision unit has determined that the duration of the input signal is greater than said predetermined time threshold and for producing an amplitude signal responsive to the amplitude of said input signal, said control signal comprising said amplitude signal, and wherein the filter is an active filter for filtering the input signal according to the amplitude of said amplitude signal.

11. A system according to claim 10, further comprising an intensity equalizer connected to said filter output for receiving therefrom an output signal from said filter, the intensity equalizer having a control input connected to said circuit means and being responsive to said control signal for amplifying said output signal from said filter according to the amplitude of the control signal when said output signal is filtered.

12. A system according to claim 10 wherein said amplitude sensor means includes a control unit connected to said control input of said filter, the control unit having amplitude first and second thresholds, and the control unit outputting said amplitude signal, said amplitude signal having a substantially constant minimum level when the amplitude of the input signal is below the first threshold, said amplitude signal being representative of the amplitude of said input signal when the amplitude of the input signal is between the first and second thresholds, and the amplitude signal having a substantially constant maximum level when the amplitude of the input signal is above the second threshold.

13. A system according to claim 12, further comprising an intensity equalizer connected to said filter output for receiving therefrom an output from said filter, the intensity equalizer having a control input connected to said circuit means and being responsive to said control signal for amplifying said output signal from said filter according to said control signal when said output signal is filtered.

14. A system according to claim 13, further comprising an input sensor between the timer and said input means, said input sensor including means for determining when the amplitude of said input signal exceeds a predetermined amplitude which is greater than zero and for enabling operation of said timer only when said input signal exceeds such predetermined amplitude.

15. A system according to claim 14, wherein the timer comprises a first current source having a control input; and a capacitor connected to the first current source and to said timer output and thereby being connected to the decision unit, said control input of said first current source being connected to said input sensor for said first current source to charge said capacitor when an input signal exists above said predetermined amplitude; whereby the voltage on the capacitor is a measure of the duration of the input signal.

16. A system according to claim 15, wherein the timer further comprises a second current source connected to the capacitor for discharging the capacitor, the second current source discharging said capacitor at a rate less than that at which the first current source charges said capacitor.

17. A system according to claim 16, wherein the input sensor comprises a rectifier between the input means and said control input of said first current source.

18. A system according to claim 17, wherein the input sensor further comprises a comparator between the rectifier and said control input of said first current source, the comparator having first and second comparator inputs, the first comparator input being connected to the rectifier and the second comparator input being connected to a reference signal representative of said predetermined amplitude, whereby the input sensor only enables operation of said timer in the presence of an input signal having a rectified amplitude greater than said predetermined amplitude.

19. A system according to claim 8, wherein said predetermined time threshold is between 100 milliseconds and 200 milliseconds.

20. A system according to claim 19, wherein said predetermined time threshold is adjustable.

21. A system according to claim 15, 16 or 18, wherein the predetermined time threshold is between 100 milliseconds and 200 milliseconds and the rate at which said predetermined time threshold is reached is adjustable by varying the capacitance of said capacitor.

22. A system according to claim 15, 16 or 18, wherein said predetermined time threshold is adjustable.

23. A system according to claim 15, wherein the rate at which said predetermined time threshold is reached is adjustable by varying the first current source.

24. A system according to claim 16, wherein the rate at which said predetermined time threshold is reached is adjustable by varying the first and second current sources.

* * * * *